United States Patent [19]

Moradi et al.

[11] Patent Number: 5,641,112
[45] Date of Patent: Jun. 24, 1997

[54] PLATE ASSEMBLY AND SOLDERING DEVICE FOR CHANGING SCREENS OF CIRCUIT BOARDS USING SOLDERING AND METHOD OF APPLICATION THEREOF

[76] Inventors: Vahid Moradi; Farid Moradi, both of 451 Richvale La., Webster, Tex. 77598

[21] Appl. No.: 497,625

[22] Filed: Jun. 30, 1995

[51] Int. Cl.$^6$ ............................................. B23K 3/00
[52] U.S. Cl. .................... 228/49.5; 228/51; 228/119; 219/85.16; 219/229
[58] Field of Search ...................... 228/119, 180.1, 228/49.5, 51, 55, 179.1; 219/229, 85.16, 85.22; 340/825.44

[56] References Cited

U.S. PATENT DOCUMENTS

| | | | |
|---|---|---|---|
| 3,050,612 | 8/1962 | Eversole | 219/26 |
| 3,084,649 | 4/1963 | Parstorfer | 113/111 |
| 3,295,189 | 1/1967 | Hammell | 29/155.5 |
| 3,813,023 | 5/1974 | Auray et al. | 228/19 |
| 4,518,110 | 5/1985 | Breske et al. | 228/51 |
| 4,555,840 | 12/1985 | Nakamura | 29/465 |
| 4,875,966 | 10/1989 | Perko | 156/580 |
| 5,152,448 | 10/1992 | Williams | 228/51 |
| 5,411,418 | 5/1995 | Welsh et al. | 439/751 |

*Primary Examiner*—Samuel M. Heinrich
*Attorney, Agent, or Firm*—Maryam Bani-Jamali

[57] ABSTRACT

This invention provides a plate assembly to be used with a soldering device for changing screens of circuit boards by soldering. The plate assembly comprises a horizontal bottom plate having a number of cylindrical passages extending therethrough; a number of narrow horizontal top plates having a number of cylindrical passages extending therethrough; a number of pads with a number of cylindrical passages extending therethrough, with each of said number of pads being placed horizontally in between the horizontal bottom plate and one of the number of narrow horizontal top plates such that each of the number of cylindrical passages through the number of narrow horizontal top plates is aligned with one of the number of cylindrical passages in the number of pads and with one of the number of cylindrical passages in the horizontal bottom plate and with one of a number of screws passing through each of the number of aligned cylindrical passages of the number of narrow horizontal top plates, of the number of pads, and of the horizontal bottom plate; a number of fixture pins being erected tightly and vertically in one of the number of cylindrical passages through the horizontal bottom plate while protruding over and above the horizontal bottom plate; and a number of guiding pins erected vertically and tightly in one of the number of cylindrical passages through the horizontal bottom plate while protruding over and above the horizontal bottom plate. The soldering device comprises: a three-dimensional, polygonal heat head having a bottom surface which comes into contact with the screen, a top surface which runs parallel to the bottom surface and which is wider than the bottom surface, said top surface being connected to a shank, a number of cylindrical passages extending from the bottom surface to the top surface through the heat head, a first side wall, a second side wall, a first end wall and a second end wall, said first side wall and said second side wall joining the bottom surface to the top surface of the heat head; and a heating handle which secures said shank of the heat head.

13 Claims, 7 Drawing Sheets

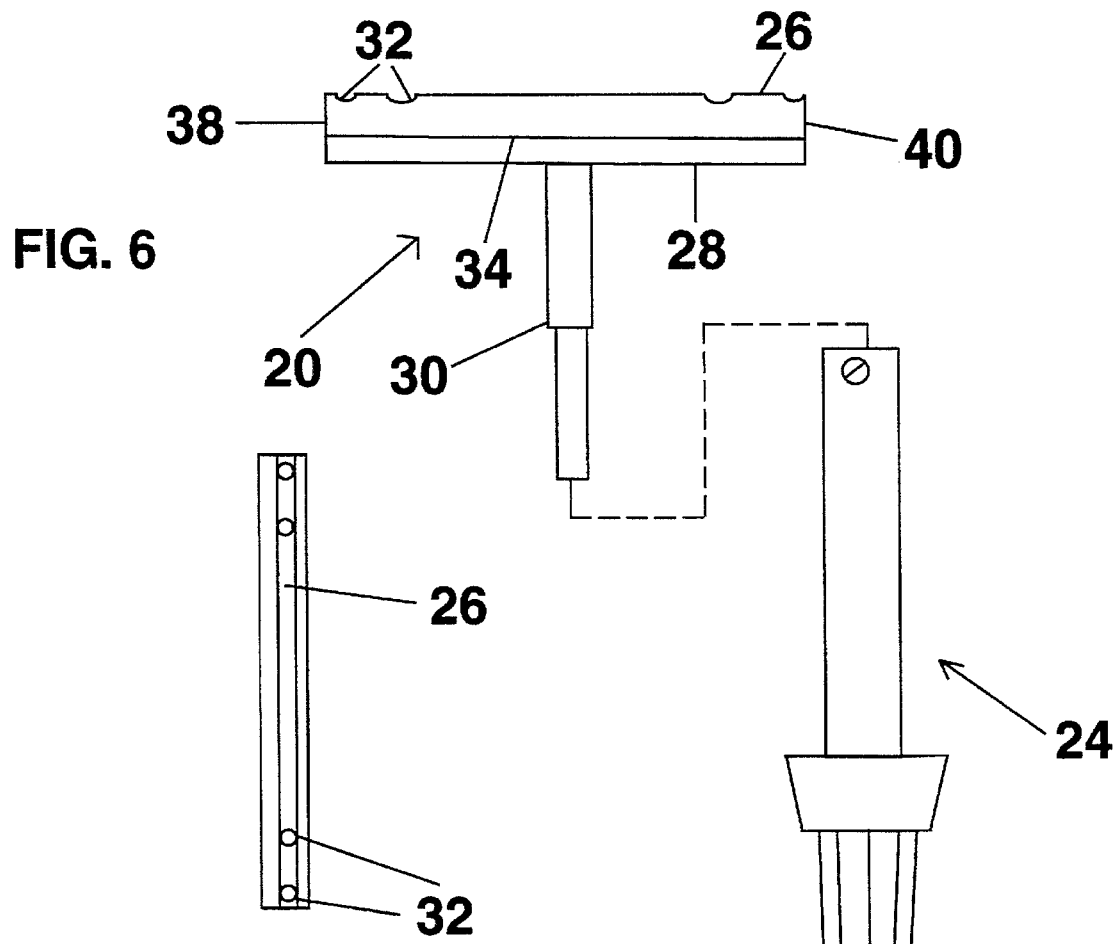

PLATE ASSEMBLY AND SOLDERING DEVICE FOR CHANGING SCREENS OF CIRCUIT BOARDS USING SOLDERING AND METHOD OF APPLICATION THEREOF

BACKGROUND OF THE INVENTION

1. Field of the Invention

This invention relates to providing a combination of a plate assembly and a soldering device for changing screens of circuit boards using soldering and a method of application thereof.

2. General Background

Any discussion of changing screens of circuit boards using soldering arouses several major issues. The first issue revolves around cost efficiency. Soldering has been used in the past for changing screens of circuit boards. However, apparatus used for soldering are very expensive. Different sets of alignment pins may be used to align layers of a plate assembly with respect to each other. In previous arrangements of pins in plate assemblies, removal and replacement of alignment pins has been time-consuming and labor-intensive. Usually, alignment pins are press-fitted into a number of plates of a plate assembly. As a result, when one alignment pin becomes bent, worn or broken, replacing the alignment pin is difficult and uneconomical. Thus, plate assemblies used for soldering of circuit boards are costly and many users of circuit boards tend to throw away a circuit board upon malfunctioning of a screen attached to the circuit board, even though the circuit board is more expensive than the screen.

Another issue is simplicity of transportation of soldering apparatus. Presently, soldering apparatus exist that are much larger and heavier than a tiny screen of a circuit board that is to be replaced. Said relatively large and heavy soldering apparatus limit transportation capabilities of said apparatus.

Other important issues relate to accuracy of locating and aligning of circuit boards and screens. Many arrangements for alignment pins result in rapid wear of the plates by the alignment pins, thus resulting in inaccurate alignments.

The issues discussed above have been ignored for a long time in production and marketing of soldering apparatus. It is believed that said issues have not been previously approached and solved by existing soldering apparatus.

3. Description of the Prior Art

Industry of soldering circuit boards has been developing over the past several decades. Some examples of the prior art is indicated in patents that have been issued in the past few decades and that are briefly discussed below.

Welsh et al., U.S. Pat. No. 5,411,418, was registered on May 2, 1995. Welsh et al. discusses a method for fabricating a combination circuit board and connector that facilitates replacement of a single damaged contact. An installing tool having channels is moved towards the circuit board to press projecting board-received parts of the contacts into circuit board holes. Upon removal of the installing tool, the contacts are left behind with their forward parts projecting up from the circuit board. The connector is then fastened to the circuit board.

Williams, U.S. Pat. No. 5,152,448, was registered on Oct. 6, 1992, and patents an integrated circuit disassembly kit apparatus that comprises an anvil member, an anvil shank and a heating gun member. Various soldered components projected through a circuit board are disassembled using the anvil member. The anvil member is heated to cause elimination of associated soldering joints of each projecting tip of an associated electrical component directed through the circuit board.

Perko, U.S. Pat. No. 4,875,966, patented on Oct. 24, 1989, presents a pressure transfer plate assembly for a heat bonding apparatus. Said apparatus is used to heat bond flexible printed circuits in a hydraulic press. The plate assembly has aluminum top and bottom plates with thin sheet liners in between. A plurality of workpiece-locating pins are based in stainless steel plug inserts in the bottom plate to give excellent wear resistance. A plurality of plate-alignment pins are used to align the top and bottom plates.

Nakamura, U.S. Pat. No. 4,555,840, was patented on Dec. 3, 1985. Nakamura patents a process and an apparatus for positioning and aligning dies on base plates. A pair of the base plates are assembled using jigs to be inserted into openings of the respective base plates. The base plates are accurately aligned in vertically parallel relationship. The upper base plate causes vertical reciprocal movement along the jigs to accurately locate and align the dies with respect to the base plates.

Auray et al., U.S. Pat. No. 3,813,023, registered on May 28, 1974, describes a device for desoldering a plurality of soldered connections on a support member. The device comprises: a heat conductive member, a plurality of spaced cavities in a contact surface of the heat conductive member, and means for applying heat to said heat conductive member. Each cavity has a bottom and a wall made of material wettable by soldering. The width and depth of each cavity is sized so that melted solder is retained in the cavity by capillary action and acts as a heat conductive medium between the heat conductive member and unmelted solder.

Hammell, U.S. Pat. No. 3,295,189, was patented on Jan. 3, 1967. Hammell discloses a method for hand-wiring terminal boards having a multiplicity of posts to be interconnected.

Parstorfer, U.S. Pat. No. 3,084,649, registered on Apr. 9, 1963, describes a desoldering tip used in soldering irons for disconnecting soldered joints. Said desoldering tip comprises: a polygonally-shaped solid head portion constituting a plurality of faces and means carried by said head portion for connection of the desoldering tip to a hand-type soldering iron. Each face contains a plurality of recesses to minimize heat transfer to each printed circuit board when a heated desoldering tip is used.

Eversole, U.S. Pat. No. 3,050,612, patented on Aug. 21, 1962, discloses a desoldering tip for melting solder. Said desoldering tip comprises a thin main plate, said plate having a plurality of unobstructed openings arranged in positions corresponding to positions of the contacts of an electrical component and said plate forming a projection adjacent each of said unobstructed openings.

Although prior art acknowledges a variety of heat bonding and desoldering apparatus and plate assemblies and methods of application thereof, it is believed that prior existing heat bonding and desoldering apparatus and plate assemblies have not been previously used in conjunction with changing screens of circuit boards as efficiently and simply as the present invention is. None of the patents described briefly above discloses a combination of a plate assembly and soldering device for changing screens of circuit boards using soldering and a method of application thereof.

SUMMARY OF THE INVENTION

A primary object of the invention is to provide a new and improved plate assembly and soldering device, used for changing screens of circuit boards by soldering, which may be easily and efficiently manufactured, marketed and applied without requiring complicated skills or knowledge.

Another object of this invention is to devise a new and improved plate assembly and soldering device, used for changing screens of circuit boards by soldering, which is of a durable and reliable construction.

An additional object of this invention is to design a new and improved plate assembly, used for changing screens of circuit boards by soldering, which is susceptible of a low cost of manufacture with regard to both materials and labor, and which accordingly is susceptible of low prices of sale to consumers, thus making such plate assembly feasible for consumers.

A further object of this invention is to provide a soldering device with a relatively efficient means of heat transfer between head of the soldering device and soldered connections in order to reduce temperature requirements and minimize amount of heat transfer and damage to the soldered connections and to parts of the plate assembly adjacent to the soldered connections.

An additional object of the present invention is to provide a method for directly applying heat to soldered connections, so that the plate assembly and the circuit board remain cool and undamaged.

Another object of the invention is to develop an improved heat head for a soldering device for connecting joints, said heat head being particularly useful for changing screens of circuit boards in a simple operation by soldering.

Still another object of this invention is to provide a method of using a new and improved plate assembly for changing screens of circuit boards by soldering.

Another object of the present invention is to provide a plate assembly that, with minimal expense, has a capacity of holding an unlimited number of circuit boards and screens depending upon the size of its different components.

A further object of this invention is to provide a plate assembly that is lightweight and portable and that gives maximum amount of advantage and application for a minimal amount of space.

A final object of this invention is to provide a plate assembly and a heat head that are designed in a manner and of material that in case of damage to a certain component, said component may be replaced at a relatively low cost and with minimal skill, without necessarily requiring any replacement of other components.

Additional objects and advantages of the invention will be set forth in part in a detailed description which follows, and in part will be obvious from the description, or may be learned by practice of the invention.

In general, the present invention has been developed against the above background, to provide application of a new and improved plate assembly and soldering device for changing screens of circuit boards by soldering. Said plate assembly for changing screens of circuit boards comprises the following basic component parts: a horizontal bottom plate, a number of narrow horizontal top plates, a number of pads, a number of fixture pins, a number of guiding pins, a number of screws and a number of cylindrical passages. The horizontal bottom plate constitutes and defines the bottom of the plate assembly. The number of pads are placed horizontally between one of the number of narrow horizontal top plates and the horizontal bottom plate. Each of the number of fixture pins, which are made up of a number of sections with each of said number of sections having a different diameter, is erected vertically in one of the number of cylindrical passages in the horizontal bottom plate, is tightly fixed in place, and serves to support the circuit board. Each of the number of guiding pins, which are preferably cylindrical, is for guiding a heat head used for soldering the circuit board and the screen and is erected vertically in one of the number of cylindrical passages in the horizontal bottom plate. Each of the number of guiding pins is preferably located adjacent to one of the number of narrow top plates and is fit relatively tightly into one of the number of cylindrical passages in the horizontal bottom plate. In contrast to pins that are press fit in other similar arrangements and require a considerable time to be removed, said number of guiding pins are easily, even manually, removable. Each of the number of narrow horizontal top plates is attached to and is placed over one of the number of pads and each of the number of pads is attached to and is placed over the horizontal bottom plate upon passing a number of screws through each pad.

The horizontal bottom plate is used as a support for changing screens of circuit boards and soldering screens to circuit boards. A new screen for replacing an original screen is rested on one of the number of narrow horizontal top plates. A board stripping solution is applied to one of the number of narrow horizontal top plates for cleaning said one of the number of narrow horizontal top plates before the new screen is positioned. A piece of silicon tape is used to cover the new screen when the heat head is used for soldering the new screen to the circuit board. The number of fixture pins and the number of guiding pins are preferably spread over the horizontal bottom plate for fixing each circuit board over the horizontal bottom plate and for guiding each new screen over one of the number of narrow horizontal top plates, respectively. Each of the number of guiding pins is tightly fit in one of the number of cylindrical passages of the horizontal bottom plate and may be either attached by glue to one of the number of cylindrical passages in the horizontal bottom plate or may be easily movable. Each of the number of narrow horizontal top plates may have engravings where the circuit boards are to be placed, said engravings made in order to minimize any damages to the circuit boards.

In a preferred embodiment, pager boards are used as the circuit boards, while the plate assembly and the soldering device are used to replace old pager screens by new pager screens. A number of guiding pins, preferably two of the guiding pins, is used for guiding the heat head of the soldering device. The soldering device resembles existing integrated circuit disassembly apparatus as presented in U.S. Pat. No. 5,152,448 by Williams. The distinguishing feature of the soldering device used in the present invention is the shape and structure of the heat head which is placed inside a heating handle. The heat head comes in contact with the piece of silicon tape which is placed on top of the new screen. The heat head used in the present invention is three-dimensional and polygonal and has a bottom surface that comes into contact with the new screen and that runs parallel to a top surface connected to a shank which can be integrally mounted to or selectively secured in the heating handle of the soldering device. The heat head has a number of cylindrical passages, preferably four cylindrical passages, running from the bottom surface to the top surface of the heat head, said bottom surface being narrower than the top surface. Said number of cylindrical passages of the heat head are arranged specific distances apart so that each of the number of cylindrical passages of the heat head may fit properly and easily in each of the number of guiding pins.

Also, this invention relates to providing a method of operation of said plate assembly. The plate assembly is used to change an original screen of the circuit board, preferably of a pager board. After separating the original screen from the circuit board, the circuit board to be bonded is placed horizontally on the horizontal bottom plate by exerting each of the number of fixture pins through a hole in the circuit board such that the circuit board is neighboring one of the number of narrow horizontal top plates. Each of said number of fixture pins positioned through one of the holes in the circuit board is then inserted into one of the number of cylindrical passages in the horizontal bottom plate. One of the number of narrow horizontal top plates where the new screen is to be set to replace the original screen is cleaned using a board stripping solution. The new screen is placed on the cleaned one of the number of narrow horizontal top plates such that the new screen and the circuit board are in contact. The heat head is attached to the heating handle of the soldering device and is then guided through a number of the guiding pins so that the heat head is placed directly over the piece of silicon tape that is placed above the new screen. Upon running an electrical current through the soldering device, the heat head is heated. Said heat head then directly heats the piece of silicon tape and indirectly heats the new screen, soldering the new screen to the circuit board. The soldering device is removed after a short period of time, and the piece of silicon tape is removed and may be reused, leaving the circuit board attached to the new screen.

Thus, the invention provides a plate assembly and a soldering device for, and a method for using said plate assembly and said soldering device, for easily and quickly replacing a damaged screen of a circuit board. The new plate assembly and heat head are expected to be more efficient and less costly per application than previous similar devices have been. Said plate assembly can be used for different-sized circuit boards and different number of circuit boards in a very short period of time upon changing the number of guiding pins and positions of said number of guiding pins and the number of fixture pins and the positions of said number of fixture pins, said number of guiding pins and said number of fixture pins being relatively cheap components that may be changed in number and that may be moved around easily as long as sufficient number of cylindrical passages exist in the horizontal bottom plate.

It is to be understood that the descriptions of this invention are exemplary and explanatory, but are not restrictive, of the invention. Other objects and advantages of this invention will become apparent from the following specification and from any accompanying charts, tables, examples and drawings.

BRIEF DESCRIPTION OF CHARTS, TABLES, EXAMPLES AND DRAWINGS

Any accompanying charts, tables, examples and drawings which are incorporated in and constitute a part of this specification, illustrate examples of preferred embodiments of the invention and, along with the description, serve to explain the principles of the invention. All parts and percentages enclosed in any tables, charts, examples and drawings, as well as anywhere in the specification, are expressed in percentages by weight.

FIG. 6 is an illustration of a heat head utilized in a soldering device in accordance with the preferred embodiment of the present invention, with the heat head shown separately from and out of a heating handle.

FIG. 7 is a bottom view of the heat head in accordance with the preferred embodiment of the present invention as shown in FIG. 6.

DETAILED DESCRIPTION OF THE PREFERRED EMBODIMENT

Preferred embodiments of the present invention are illustrated in any charts, tables, examples and drawings that follow.

The present invention provides a new and improved plate assembly 2 (as shown in FIG. 1, FIG. 2, FIG. 3, FIG. 4, FIG. 5(a) and FIG. 5(b)) and a soldering device 22 (as shown in FIG. 6 and FIG. 7) for changing old screens of circuit boards (not shown) and soldering new screens (not shown) to circuit boards. (Please refer to FIG. 8.) In addition the present invention demonstrates a method for soldering new screens to circuit boards by using said plate assembly 2 and the soldering device 22.

Devices other than conventional circuit boards and screens can be part of the combination of "circuit board" and "screen", respectively, and any device similar to a thin small screen that can be soldered to a device similar to a circuit board and that can come in contact with a heat head 20 of the soldering device 22 are included in the term "screen" and "circuit board", respectively.

Figure 1:
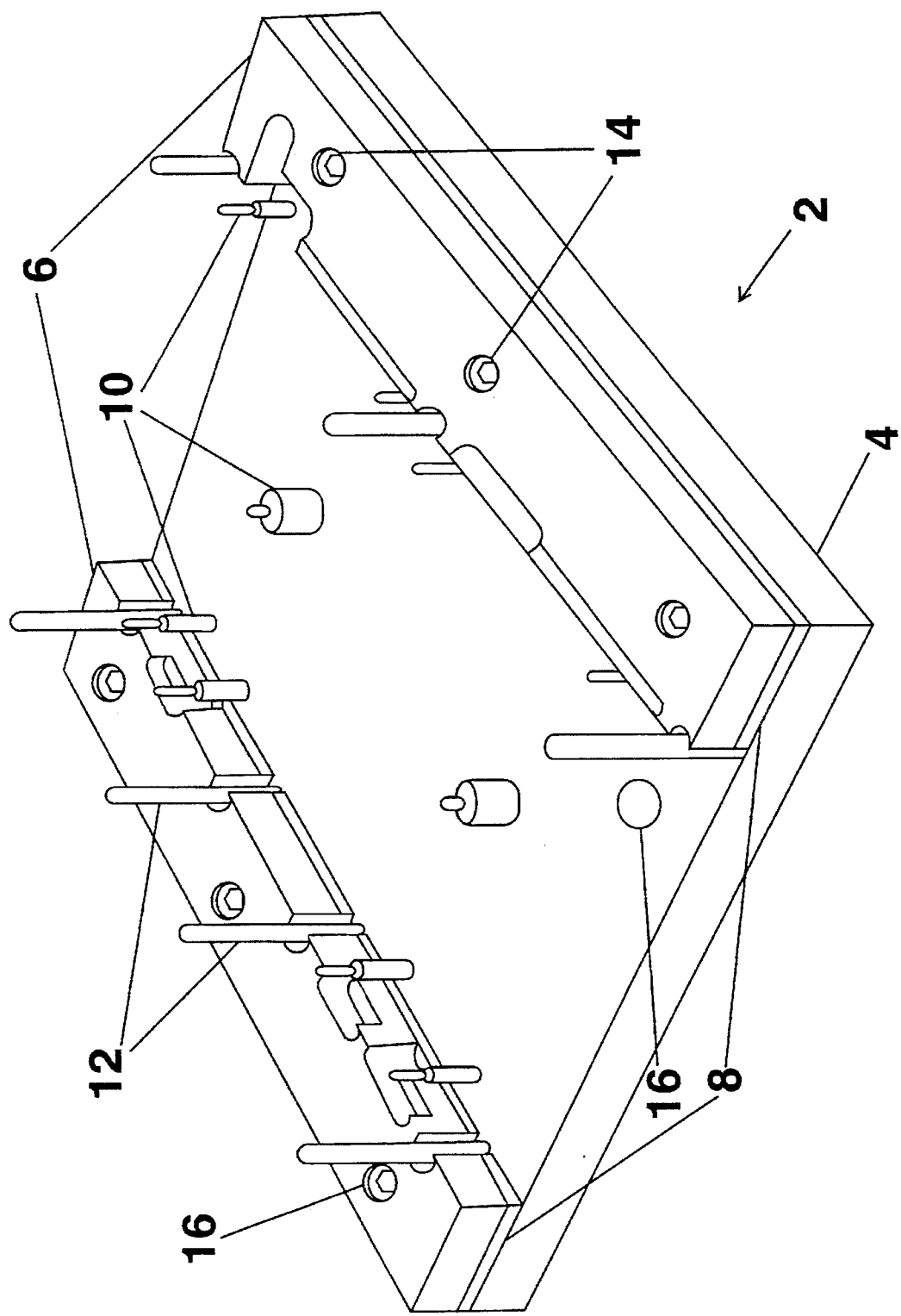
FIG. 1 is a perspective view of a preferred embodiment of a plate assembly for soldering screens to circuit boards.
Figure 2:
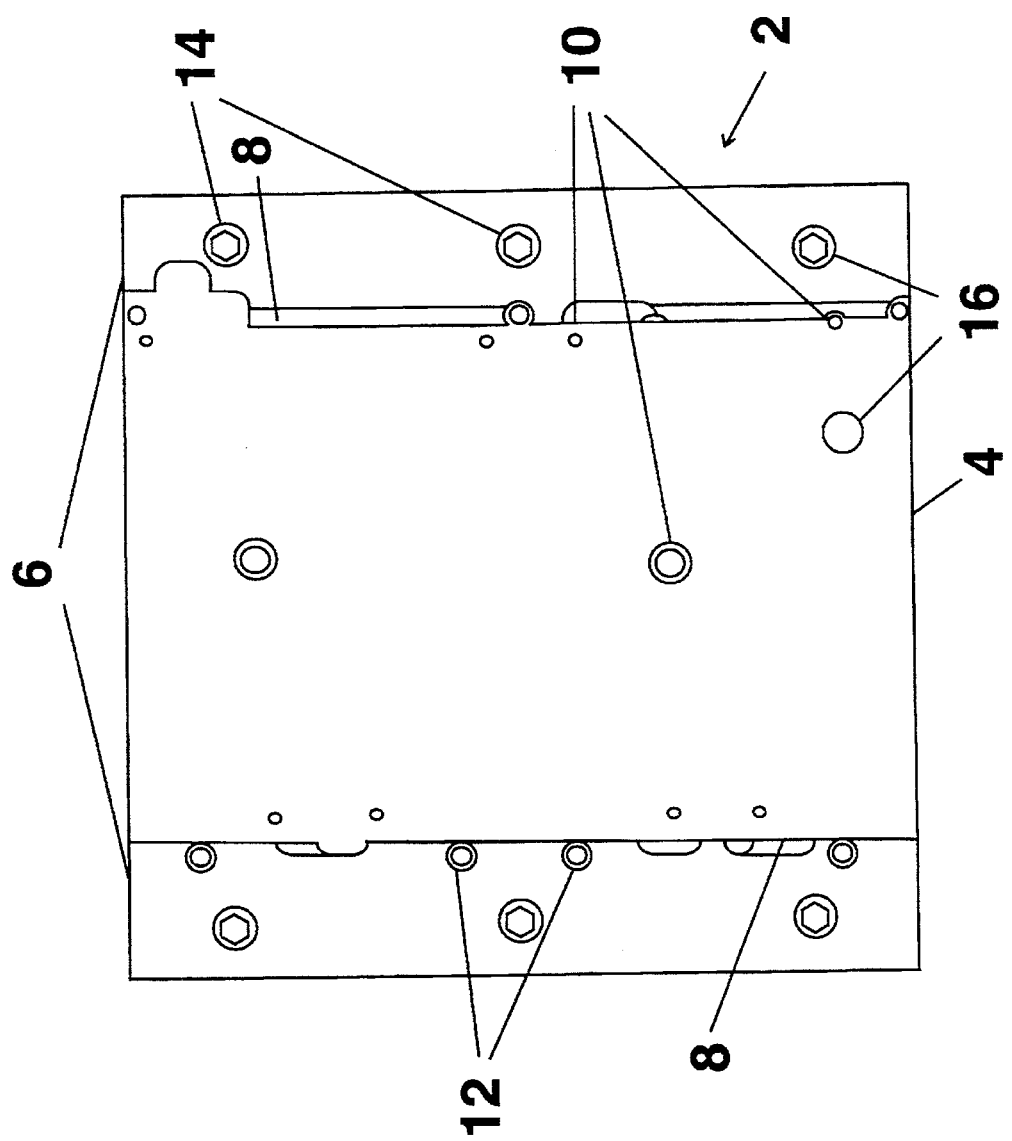
FIG. 2 is a top plan view of the preferred embodiment of the plate assembly for soldering screens to circuit boards as shown in the preferred embodiment of the present invention as shown in FIG. 1.
Figure 3:
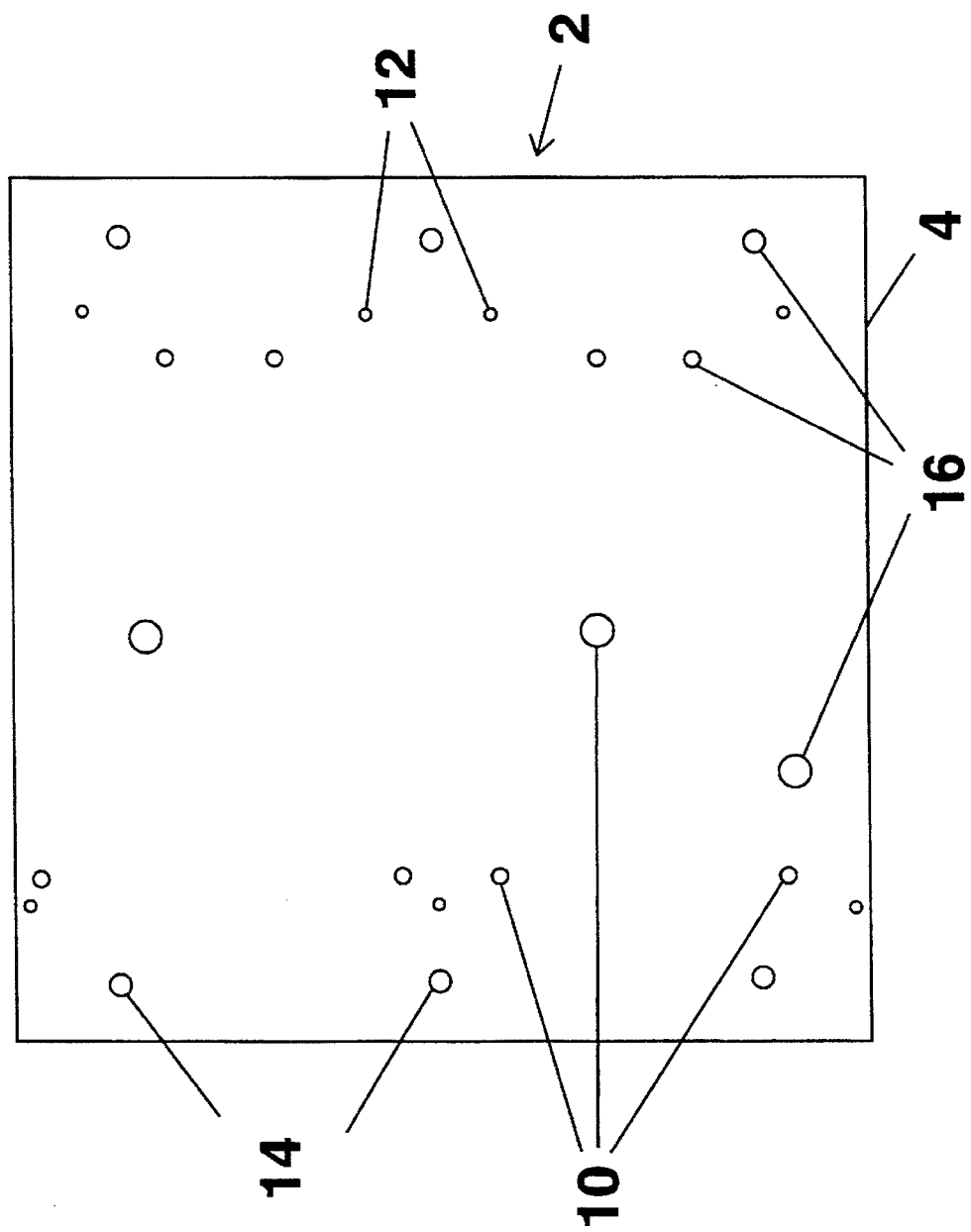
FIG. 3 is a back plan view of the plate assembly for soldering screens to circuit boards in accordance with the preferred embodiment of the present invention as shown in FIG. 1.
Figure 4:
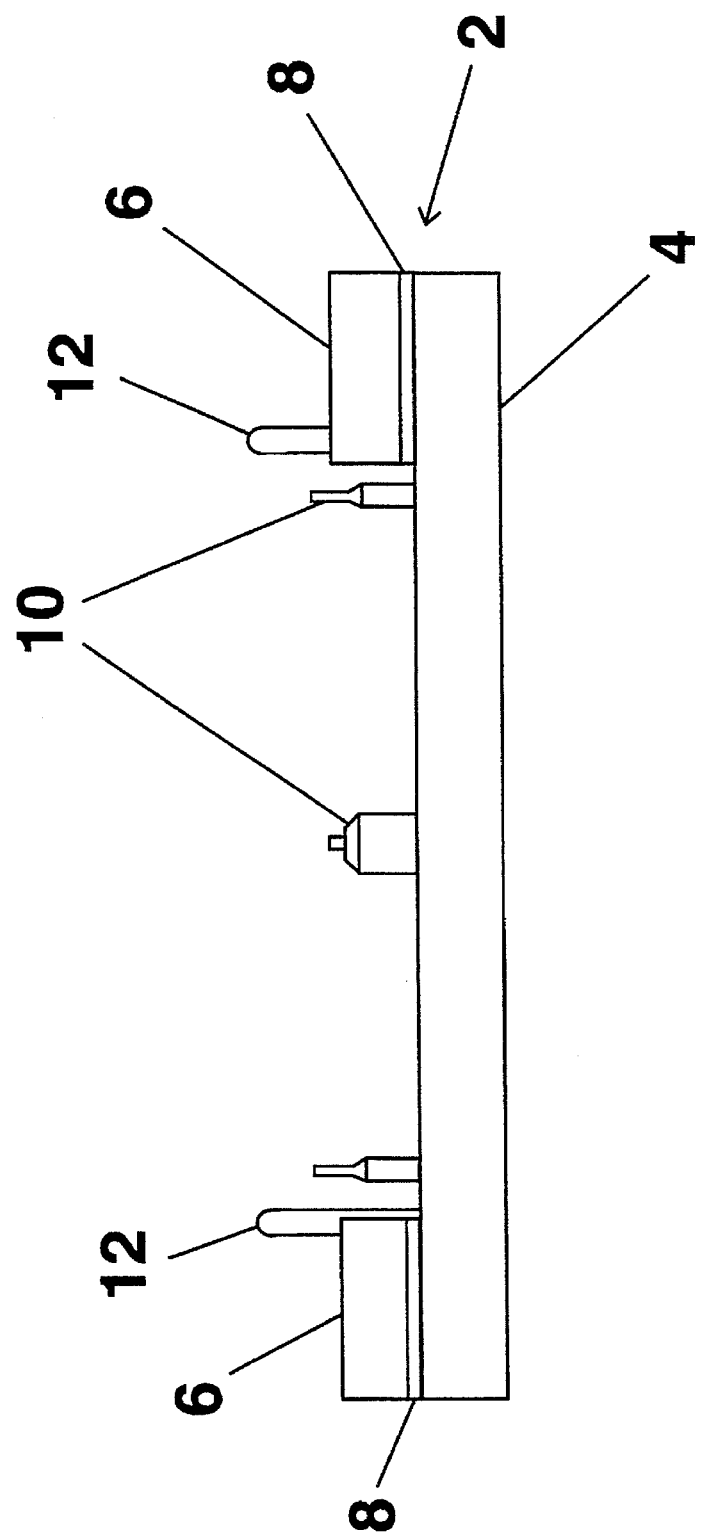
FIG. 4 is an end view of the plate assembly for soldering screens to circuit boards in accordance with the preferred embodiment of the present invention as shown in FIG. 1.
Figure 5A:
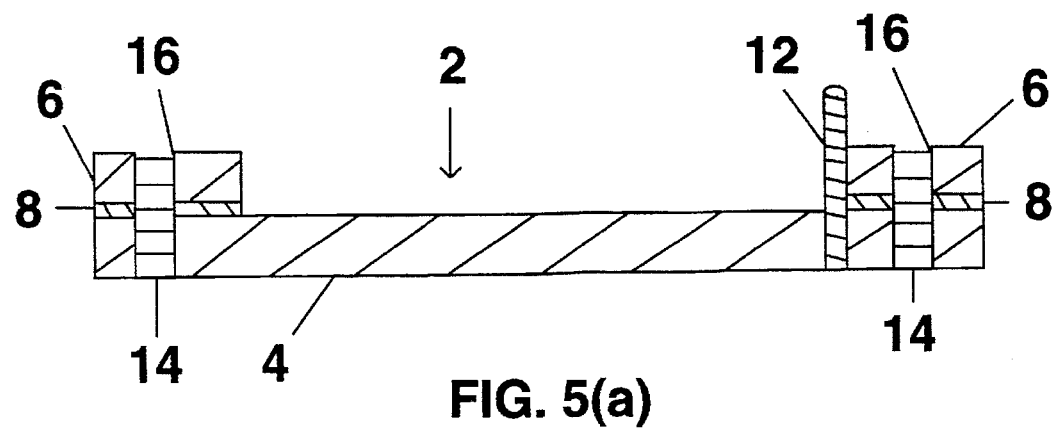
FIG. 5(a) is a cross-sectional view of a part of the plate assembly, showing details of one of a number of guiding pins and a number of screws in accordance with the preferred embodiment of the present invention as shown in FIG. 1.
Figure 5B:
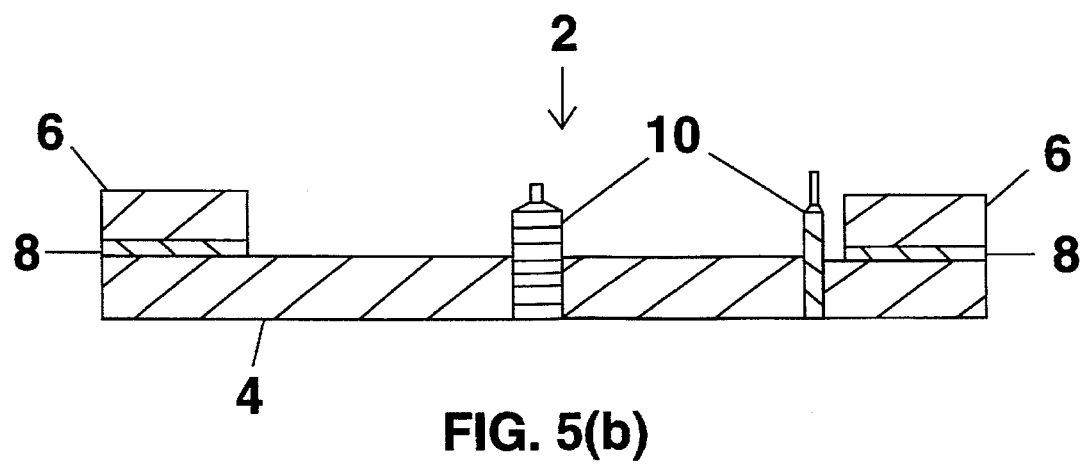
FIG. 5(b) is a cross-sectional view of a part of the plate assembly, showing details of a number of fixture pins in accordance with the preferred embodiment of the present invention as shown in FIG. 1.

As shown in FIG. 1 and FIG. 2, the plate assembly 2 comprises the following basic component parts: a horizontal bottom plate 4, a number of narrow horizontal top plates 6, a number of pads 8, a number of fixture pins 10, a number of guiding pins 12, a number of screws 14 and a number of cylindrical passages 16. The horizontal bottom plate 4 constitutes and defines bottom of the plate assembly 2. Through said horizontal bottom plate 4, said number of narrow horizontal top plates 6 and said number of pads 8, said number of cylindrical passages 16 extend. Through the number of cylindrical passages 16 in the horizontal bottom plate 4, the number of fixture pins 10 and the number of guiding pins 12 may be positioned, thus protruding outwards on top of the bottom plate 4. (Please refer to FIG. 1, FIG. 4, FIG. 5(a), FIG. 5(b) and FIG. 8.) Each of the number of cylindrical passages 16 through each of the number of narrow horizontal top plates 6 is aligned with one of the number of cylindrical passages 16 in one of the number of pads 8 and simultaneously with one of the number of cylindrical passages 16 in the horizontal bottom plate 4 so that one of the number of screws 14 may be passed through said one of the number of cylindrical passages 16 in said one of the number of narrow horizontal top plates 6, through said one of the number of cylindrical passages 16 in said one of the number of pads 8, and through said one of the number of cylindrical passages 16 in said horizontal bottom plate 4 simultaneously. Through each of the number of narrow horizontal top plates 6, each of the number of pads 8 and the horizontal bottom plate 4, some of the number of screws 14 extends vertically and downwardly from top of each of the narrow horizontal top plates 6 to bottom of the horizontal bottom plate 4, holding each of the number of narrow horizontal top plates 6 attached to one of the number of pads 8 and the horizontal bottom plate 4. Each of the number of pads 8 is basically of similar size and shape as one of the number of narrow horizontal top plates 6 and is placed horizontally between said one of the number of narrow top plates 6 and the horizontal bottom plate 4. (Please refer to FIG. 1, FIG. 4, FIG. 5(a) and FIG. 5(b).) In a preferred embodiment, the horizontal bottom plate 4, the number of narrow horizontal top plates 6 and the number of pads 8 are rectangular in shape. Thus, in an embodiment where two of the number of narrow horizontal top plates 6 are placed in parallel on two opposite sides of the horizontal bottom plate 4, basically a rectangular opening remains between the two of the number of narrow horizontal top plates 6, with circuit boards being positioned upon said rectangular opening to achieve maximal stability during soldering. Each of the number of narrow top plates 6 is screwed by at least one of the number of screws 14 to one of the number of pads 8 and then to the horizontal bottom plate 4, with each of the number of narrow horizontal top plates 6 running parallel to and directly above one of the number of pads 8 and to and indirectly above the horizontal bottom plate 4. (Please refer to FIG. 5(a).) In a preferred embodiment, the number of narrow horizontal top plates 6 has a height of about 2.3 cm (about 0.88 in.) and the horizontal bottom plate has a height of about 1.0 cm. (about 2.6 in.). In one particular embodiment, the horizontal bottom plate 4 of approximately 15.1 cm.×15.2 cm. (about 6.0 in.×5.94 in.) and the number of narrow horizontal top plates 6 of approximately 2.5 cm×15.1 cm (about 1.0 in.×5.94 in.) are preferably made of non-static pressed aluminum. In a preferred embodiment, sections of the number of narrow horizontal top plates 6 neighboring the circuit boards and neighboring the number of guiding pins 12 and some of the number of fixture pins 10, may be engraved in order to facilitate placement of circuit boards, of screens, of any of the number of fixture pins 10 that neighbor one of the number of narrow horizontal top plates 6, and of the number of guiding pins 12. Use of the number of fixture pins 10 and the number of guiding pins 12 that are preferably made of metal results in a longer-lasting, wear-resistant plate assembly 2.

As shown in FIG. 1, the number of fixture pins 10 preferably have a number of sections, with each section having a different diameter. In one embodiment, each of the number of fixture pins 10 has two cylindrical sections different diameters connected to one another, with the cylindrical section of larger diameter located below the cylindrical section of smaller diameter. Each of the number of fixture pins 10 extends through one of the number of cylindrical passages 16 in the horizontal bottom plate 4 and projects vertically upward and outward from the horizontal bottom plate 4, being erected vertically and serving to position circuit boards more accurately and in a more stable manner. In a preferred embodiment, the number of cylindrical passages 16 in the horizontal bottom plate 4 have a diameter in the range of between about 0.2 cm. to 0.7 cm. (about 0.08 in. to 0.27 in.), depending upon type of and diameter of pin to be inserted in each of the number of cylindrical passages 16. Said number of fixture pins 10 are preferably not movable and serve to support the circuit board. Although it is more preferable to fix each of the number of fixture pins 10 by glue to each of the number of cylindrical passages 16 wherein each of the number of fixture pins 10 is placed, it is possible to press-fit each of the number of fixture pins 10 into each of the number of cylindrical passages 16 drilled through the horizontal bottom plate 4. It is also possible to use the number of fixture pins 10 that, despite being fixed very securely in each of the number of cylindrical passages 16 due to closeness in size of each of the number of fixture pins 10 to each of the number of cylindrical passages 16, are movable upon exertion of enough force. The number of fixture pins 10 and the sections of the number of fixture pins 10 can come in different sizes, heights and diameters. In a preferred embodiment, the number of fixture pins 10 may be shorter than the number of guiding pins 12. In a preferred embodiment, a group of the number of fixture pins 10 which are located close to the number of narrow horizontal top plates 6 have a height of approximately 2.5 cm (about 1.0 in.), with the diameter of each of the larger cylindrical sections extending through the horizontal bottom plate 4 being about 0.3 cm (about 0.12 in.) and of each of the smaller cylindrical sections located on top of each of said group of the number of fixture pins 10 protruding over and above the horizontal bottom plate 4 being approximately 0.1 cm (about 0.04 in.). (Please refer to FIG. 5(b).) Another group of the number of fixture pins 10 which are located farther from the number of narrow horizontal top plates 6 have a height of about 2.2 cm (about 0.86 in.), with the diameter of each of the larger cylindrical sections extending through the horizontal bottom plate 4 being approximately 0.6 cm (about 0.23 in.) and of each of the smaller cylindrical sections located on top of each of said group of the number of fixture pins 10 protruding over and above the horizontal bottom plate 4 being about 0.2 cm (about 0.08 in.). Most preferably, the larger cylindrical section serves as the bottom cylinder. In a most preferred embodiment, the number of fixture pins 10 may comprise metal, preferably copper.

The number of guiding pins 12, which are preferably thin cylinders, are for guiding the heat head 20 used for soldering the circuit board and the screen and are each erected vertically in one of a number of cylindrical passages 16 in the horizontal bottom plate 4. As shown in FIG. 1 and in FIG. 2, each of the number of guiding pins 12 is preferably located adjacent to one of the number of narrow horizontal top plates 6 and is fit relatively tightly into one of the number of cylindrical passages 16 in the horizontal bottom plate 4. Each of the number of guiding pins 12 has an outer diameter substantially equal to an inner diameter of one of the number of cylindrical passages 16 in the horizontal bottom plate 4 in which one of the number of guiding pins 12 is placed so that each of the number of guiding pins 12 may be fitted in one of the number of cylindrical passages 16 without clearance. Each of the number of guiding pins 12 can either be fixed, for example by glue, or may be relatively tightly fixed while being simultaneously relatively easily removable. Tight fixture of each of the number of guiding pins 12 allows quick replacement of each of the number of guiding pins 12 that becomes worn, bent or broken or that needs to be removed for testing, repair or exchange purposes. Also, each of the number of fixture pins 10 that are removable, even though tightly fixed, may be as easily removed upon being damaged or for fixing different-sized circuit boards in accurate place. In a preferred embodiment, each group of the number of guiding pins 12, which are erected vertically upward on and outward from the horizontal bottom plate 4, is positioned adjacent to one of the number of narrow horizontal top plates 6. The number of guiding pins 12 are metallic, and preferably comprise stainless steel. Said number of guiding pins 12 has a height of approximately 3.1 cm (about 1.2 in.), with a diameter of about 0.2 cm (about 0.08 in.). The number of fixture pins 10 and the number of guiding pins 12 are most preferably used for aligning circuit boards, and screens and the soldering device 22, respectively. Distances between each pair of the number of fixture pins 10, as well as between each pair of the number of guiding pins 12, may vary depending upon the circuit boards, the soldering screen and the soldering device 22 being used. The function of the number of fixture pins 10 and the number of guiding pins 12 is to align pairs of layers, for example the circuit board with the screen, so that soldering of said pairs of layers is carried out as accurately as possible. The number of guiding pins 12, in particular, serve to automatically and accurately position the new screen in a desired location such that the heat head 20 of the soldering device is perfectly positioned on the new screen to be attached to the circuit board.

The horizontal bottom plate 4 is used as a support for changing screens of circuit boards and soldering screens to circuit boards. Each of the number of narrow horizontal top plates 6 is used to support a new screen to replace an original screen. A board stripping solution is applied for cleaning each of the number of narrow horizontal top plates 6 where the new screen is to be set. Said board stripping solution preferably comprises methyl ethyl ketone, xylene and butyl acetate. The board stripping solution is manufactured by GC Electronics and is available in the market as "P.C. Board Stripping Solution". A piece of silicon tape (not shown in the drawings) is used to cover the new screen when the heat head 20 is used for soldering the new screen to the circuit board. The number of fixture pins 10 and the number of guiding pins 12 are spread, preferably in pairs, across the horizontal bottom plate 4. Said number of fixture pins 10 and said number of guiding pins 12 are erected from and through the horizontal bottom plate 4, and serve to guide each circuit board over the horizontal bottom plate 4 and each new screen over one of a number of top plates 6, respectively. Since different sizes of plate assemblies 2 are available, each of the screens may not necessarily cover each of the number of narrow horizontal top plates 6.

Figure 8:
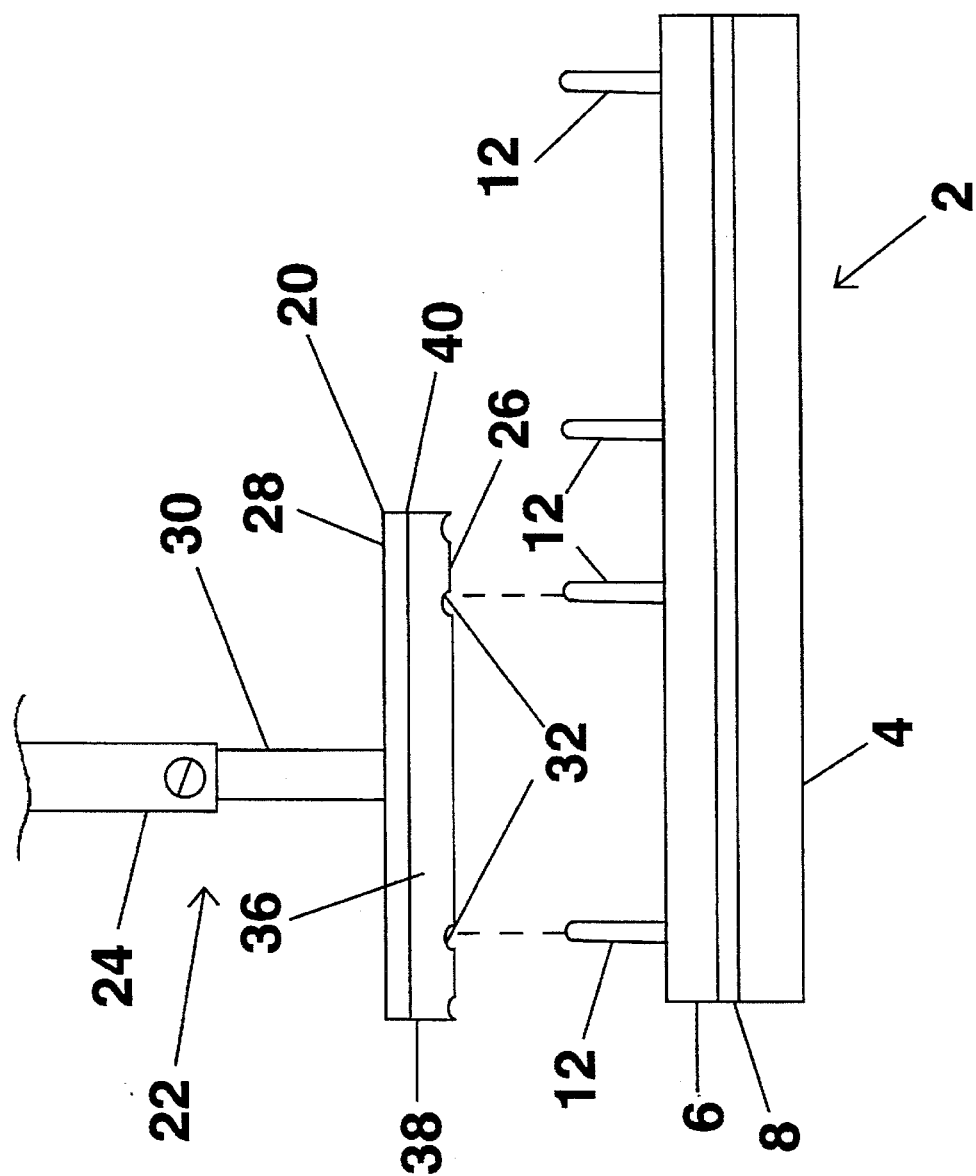
FIG. 8 is a cross-sectional view of the heat head of the soldering device as a number of cylindrical passages of said heat head are being placed through a number of guiding pins in accordance with the preferred embodiment of the present invention as shown in FIG. 6.

In a preferred embodiment, pager boards are used as the circuit boards and the plate assembly 2 is used to replace old pager screens by new pager screens. Two guiding pins 12 are used for guiding the heat head 20 of a soldering device 22 (please refer to FIG. 8). The soldering device 22 resembles existing integrated circuit disassembly apparatus as presented in U.S. Pat. No. 5,152,448 by Williams. The distinguishing feature of the soldering device 22 used in the present invention is the shape and structure of the heat head 20. As shown in FIG. 6, the heat head 20 can be attached to a heating handle 24, that comes in contact with the piece of silicon tape placed on top of the new screen. Although the heat head 20 may take any desired shape, in the most preferred embodiment of the heat head 20, an area of the heat head 20 that comes into contact with the screen to be soldered has a relatively small surface area. (Please refer to FIG. 7.) Said heat head 20 is simpler and more cost efficient than heat presses that are presently available in the market. As shown in FIG. 6, the heating handle 24 resembles a heating gun member used with the integrated circuit disassembly apparatus of Williams. The heating handle 24 is presently available in the market as a component of "Weller®" Soldering Iron and is manufactured by Cooper-Tools. In a preferred embodiment of the present invention, the heating handle 24 of a 40 Watt Medium Duty "Weller®" Soldering Iron is used. As shown in FIG. 6, FIG. 7 and FIG. 8, the heat head 20 used in the present invention is three-dimensional and polygonal, has a bottom surface 26 that comes into contact with the new screen and is heat conductive. The bottom surface 26 of the heat head 20 runs parallel to a top surface 28 connected to a shank 30, with said bottom surface 26 being narrower than the top surface 28. Said shank 30 can be integrally mounted on the top surface 28 of the heat head 20. (Please refer to FIG. 6 and FIG. 8.) A portion of said shank 30 can be selectively secured in the heating handle 24 of the soldering device 22 in any conventional manner, preferably by screwing the shank 30 to the heating handle 24 upon inserting the portion of the shank 30 into the heating handle 24 (please refer to FIG. 6). The heating handle 24 is adapted to conductively heat the heat head 20 by electric current from appropriate conventional conductors (not shown) connected to the heating handle 24, in a conventional manner. The shank 30 is preferably orthogonally mounted medially on the top surface 28 of the heat head 20 in order to set the shank 30 in an orthogonal relationship relative to the bottom surface 26 of the heat head 20. Said heat head 20 also has a first side wall 34 spaced from a second side wall 36, with said first side wall 34 and said second side wall each joining the bottom surface 26 to the top surface 28 of the heat head 20. In addition, the heat head 20 has a first end wall 38 and a second end wall 40 running, preferably parallel to one another, at each end of the heat head 20. The heat head 20 has a number of cylindrical passages 32, preferably four cylindrical passages 32, running vertically through the heat head 20 and from the bottom surface 26 to the top surface 28 of the heat head 20. Said number of cylindrical passages 32 in the heat head 20 are arranged specified distances apart so that each of the number of cylindrical passages 32 can fit properly and easily in each of the guiding pins 12.

In a preferred embodiment, the heat head 20 has a length of about 7.8 cm. (about 3.0 in.), a width of about 0.8 cm. (about 0.3 in.) and a height of about 1.1 cm. (about 0.4 in.). The bottom surface 26 of the heat head 20 has a width of about 0.3 cm. (about 0.1 in.). The top surface 28 of the heat head 20 has a width of about 0.8 cm. (about 0.3 in.). The shank 30 is preferably over about 2.6 cm. (about 1.0 in.) in length and about 0.8 cm. (about 0.3 in.) in diameter. The number of cylindrical passages 32 extending vertically through the heat head 20 have a diameter of about 0.4 cm. (about 0.16 in.) and have a height equivalent to the height of the heat head 20. The first side wall 34 and the second side wall 36 first run vertically down from the top surface 28 for about 0.3 cm. (about 0.1 in.) and then run for about 0.9 cm (about 0.35 in.) slantedly towards the bottom surface 26. Some engravings may exist in the first side wall 34 and in the second side wall 36 of the heat head 20, preferably closer to the bottom surface 26 of the heat head 20, in order to facilitate utilization, improve performance and increase efficiency of the heat head 20. The bottom surface 26, the first side wall 34, the second side wall 36, the first end wall 38 and the second end wall 40 of the heat head 20 are formed of a material that is non-wettable by liquid solder. This can be achieved, for example, by plating the heat head 20 by a material that is non-wettable by solder. Internal surfaces of the number of cylindrical passages 32 in the heat head 20 are not plated in order to preserve their wetting characteristics. The heat head 20 serves as an efficient heat transfer medium, reducing the temperature to which the heat head 20 must be heated in order to transfer sufficient amount of heat to the screen, thus minimizing the possibility of heat damage to the plate assembly 2, particularly to the number of narrow horizontal top plates 6, the screens and the circuit boards, and to a smaller extent to the number of guiding pins 12 and the number of fixture pins 10. To minimize the amount of heat transferred to parts adjacent to the screen when said screen is heated by the heat head 20 and to minimize any damage to the circuit board and to the screen by heat, the bottom surface 26 of the heat head 20 is preferably reduced in area by forming the number of cylindrical passages 32 in said heat head 20, thus creating a number of slots in the bottom surface 26, and by minimizing the dimensions of the bottom surface 26. Due to creation of the number of slots in the bottom surface 26 and escape of heat through said number of cylindrical passages 32, heat transfer to adjacent parts is minimized. Thus, the plate assembly 2 may remain as cool and undamaged as possible. Soldering is thus effected more rapidly and more efficiently by the heat head 20 of the present invention while keeping the temperature of, the damages to, and the costs of components of the plate assembly 2, particularly of the number of narrow horizontal top plates 6, the number of fixture pins 10 and the number of guiding pins 12, as low as possible.

Although different sizes, shapes and configurations may be applied for different components of the plate assembly 2 and of the soldering device 22, production of said plate assembly 2 and said soldering device 22 is a simple task and does not require complicated skills or knowledge. The plate assembly 2 and the heat head 20, which are the unique components of the present invention, may be cost efficiently produced by machines commonly and economically used in industry.

Despite said simple structure and with a minimal expense, the plate assembly 2 has a capacity of holding many different types and a large number of circuit boards and screens depending upon the size of the horizontal bottom plate 4, upon positions of and quantity of the number of narrow horizontal top plates 6, upon positions of and quantity of the number of fixture pins 10 and the position of and quantity of the number of guiding pins 12. For example, the plate assembly 2 and the heat head 20 may be used with most commonly used pagers, including but not limited to Bravo, Plus, Lifestyle, Classic, Express and Uniden XLT.

Meanwhile, the plate assembly 2 is light-weight and portable. The plate assembly 2 is easy to use and light to carry and move around, and gives maximum amount of advantage and application for a small amount of space. The varying possible designs of the plate assembly 2 maximizes the number of circuit boards and screens, comprising pager boards and pager screens, that may be positioned on the horizontal bottom plate 4 and on the number of narrow horizontal top plates 6, respectively.

Due to use of above listed components in producing the plate assembly 2 and the heat head 20, production costs are decreased. The horizontal bottom plate 4, the number of narrow horizontal top plates 6, the number of fixture pins 10, the number of guiding pins 12 and the heat head 20 are relatively durable, up to several years, if not decades, as long as proper care is taken. The plate assembly 2 and the heat head 20 are designed in a manner and of material that in case of damage to a component, said component may be replaced at a relatively low cost and with minimal skill, without necessarily requiring any replacement of other components.

Also, this invention relates to providing a method of operation of said plate assembly 2. The plate assembly 2 is used to change an original screen of a circuit board, preferably of a pager board. After separating the original screen from the circuit board, the circuit board to be bonded is placed on top of the horizontal bottom plate 4 by positioning a group of the number of fixture pins 10, preferably a pair of fixture pins 10, through some holes in the circuit board such that the circuit board is positioned in a stable manner and neighbors one of the number of narrow horizontal top plates 6. In order to minimize movement of the circuit board, the circuit board is positioned such that the circuit board is removably attached to the group of the number of fixture pins 10 and such that each of the number of fixture pins 10 protrudes through one of the holes of the circuit board. Thus, while the movements of the circuit board are minimized, movability of the circuit board is simplified. One of the number of narrow horizontal top plates 6 whereon a corresponding new screen is to be placed to replace the original screen is cleaned using the board stripping solution. The new screen is placed on the cleaned one of the number of narrow horizontal top plates 6 such that the new screen and the circuit board are in contact. The heat head 20 is positioned in the soldering device 22 and is then guided through a number of guiding pins 12 to be placed directly over the piece of silicon tape that is placed above the new screen. Upon running an electrical current through the soldering device 22, the heat head 20 is heated and directly heats the piece of silicon tape and indirectly heats the new screen, soldering the new screen to the circuit board. The soldering device 22 is removed after a short period of time, and the piece of silicon tape is removed as well, leaving the circuit board attached to the new screen.

The plate assembly 2 and heat head 20 are expected to be more efficient and less costly per application. Upon changing positions of and quantity of the number of guiding pins 12 and the number of fixture pins 10 which are relatively cheap components, said plate assembly 2 can be utilized for different-sized circuit boards and is usable for a different number of circuit boards in a very short period of time. If extra space is needed to increase the capacity of the plate assembly 2, the number of top plates 6 may be increased, a larger bottom plate 4 may be used, a larger number of fixture pins 10 and a larger number of guiding pins 12 may be used, and the number of cylindrical passages 16 in the horizontal bottom plate 4 may be increased.

Thus, a method is developed for easily and efficiently changing screens of circuit boards by soldering. The method of operation of the plate assembly 2 and the soldering device 22 is easy to learn and perform. By using said method of soldering, heat is indirectly applied to soldered connections and, thus, the plate assembly and the circuit board remain cool and undamaged.

Certain objects are set forth above and made apparent from the foregoing description, drawings and examples. However, since certain changes may be made in the above description, drawings and examples without departing from the scope of the invention, it is intended that all matters contained in the foregoing description, drawings and examples shall be interpreted as illustrative only of the principles of the invention and not in a limiting sense. With respect to the above description and examples then, it is to be realized that any descriptions, drawings and examples deemed readily apparent and obvious to one skilled in the art and all equivalent relationships to those stated in the examples and described in the specification or illustrated in the drawings are intended to be encompassed by the present invention.

Further, since numerous modifications and changes will readily occur to those skilled in the art, it is not desired to limit the invention to the exact construction and operation shown and described, and accordingly, all suitable modifications and equivalents may be resorted to, falling within the scope of the invention. It is also to be understood that the following claims are intended to cover all of the generic and specific features of the invention herein described, and all statements of the scope of the invention which, as a matter of language, might be said to fall therebetween.

What is claimed as invention is:

1. A plate assembly to be used with a soldering device for changing screens of circuit boards by soldering, said plate assembly comprising:

(a) a horizontal bottom plate having a number of cylindrical passages extending therethrough, said horizontal bottom plate constituting bottom of the plate assembly;

(b) a number of narrow horizontal top plates having a number of cylindrical passages extending therethrough;

(c) a number of pads having a number of cylindrical passages extending therethrough, with each of said number of pads being placed horizontally in between the horizontal bottom plate and one of the number of narrow horizontal top plates such that each of the number of cylindrical passages through the number of narrow horizontal top plates is aligned with one of the number of cylindrical passages in the number of pads and with one of the number of cylindrical passages in the horizontal bottom plate;

(d) a number of fixture pins being used for minimizing movement of and securely supporting the circuit boards, each of said number of fixture pins comprising a number of sections, with each of said number of sections having a different diameter and with each of said number of fixture pins being erected tightly and vertically in one of the number of cylindrical passages through the horizontal bottom plate while protruding over and above the horizontal bottom plate;

(e) a number of guiding pins being used for securely supporting, guiding and minimizing movement of the soldering device when said soldering device is used to attach a new screen to said circuit board and being used for minimizing movement of the new screen, each of the number of guiding pins being erected vertically and tightly in one of the number of cylindrical passages through the horizontal bottom plate while protruding over and above the horizontal bottom plate, and each of the number of guiding pins being located adjacent to one of the number of narrow horizontal top plates; and (f) a number of screws being used for securing each of the number of narrow horizontal top plates to one of the number of pads and securing each of the number of pads to the horizontal bottom plate simultaneously, with each of the number of screws extending vertically downwards through one of the number of narrow horizontal top plates, through one of the number of pads and finally through the horizontal bottom plate simultaneously.

2. The plate assembly to be used with the soldering device for changing screens of circuit boards by soldering according to claim 1, wherein said soldering device comprises:

(a) a three-dimensional, polygonal heat head having a bottom surface which comes into contact with the screen, a top surface which runs parallel to the bottom surface and which is wider than the bottom surface, said top surface being connected to a shank, a number of cylindrical passages extending from the bottom surface to the top surface through the heat head, a first side wall, a second side wall, a first end wall and a second end wall, said first side wall and said second side wall joining the bottom surface to the top surface of the heat head, and said first end wall and said second end wall joining the first side wall to the second side wall; and (b) a heating handle which secures said shank of the heat head.

3. The plate assembly to be used with the soldering device for changing screens of circuit boards by soldering according to claim 1, wherein said circuit board is a pager board.

4. The plate assembly to be used with the soldering device for changing screens of circuit boards by soldering according to claim 1, wherein the number of guiding pins and the number of fixture pins are metallic and may be easily removed and wherein the horizontal bottom plate and the number of narrow horizontal top plates are made of non-static pressed aluminum.

5. The plate assembly to be used with the soldering device for changing screens of circuit boards by soldering according to claim 1, wherein each of the number of pads is shaped and sized similar to one of the number of narrow horizontal top plates.

6. The plate assembly to be used with the soldering device for changing screens of circuit boards by soldering according to claim 1, wherein each of the number of narrow horizontal top plates is engraved on a side in order to minimize any damages to neighboring circuit boards and in order to facilitate placement of circuit boards, of screens, of the number of guiding pins and of any of the number of fixture pins which neighbor one of the number of narrow horizontal top plates.

7. The plate assembly to be used with the soldering device for changing screens of circuit boards by soldering according to claim 1, wherein the following dimensions are used in a preferred embodiment of the plate assembly:

(a) the number of narrow horizontal top plates has a height of about 2.3 cm, a width of about 2.5 cm, and a length of about 15.1 cm;

(b) the horizontal bottom plate has a height of about 1.0 cm, a width of about 15.1 cm and a length of about 15.2 cm;

(c) the number of cylindrical passages in the horizontal bottom plate has a diameter in the range of between about 0.2 cm to 0.7 cm, depending upon type and diameter of pin to be inserted in each of the number of cylindrical passages;

(e) the number of fixture pins which is located close to the number of narrow horizontal top plates has a height of about 2.5 cm, a diameter of one section extending through the horizontal bottom plate is about 0.3 cm, and a diameter of another section located on top of said number of fixture pins located close to the number of narrow horizontal top plates is about 0.1 cm;

(f) the number of fixture pins which is located farther from the number of narrow horizontal top plates has a height of about 2.2 cm, a diameter of one section extending through the horizontal bottom plate is about 0.6 cm, and a diameter of another section located on top of said number of fixture pins located farther from the number of narrow horizontal top plates is about 0.2 cm; and (g) the number of guiding pins has a height of about 3.1 cm and a diameter of about 0.2 cm.

8. The soldering device to be used with the plate assembly for changing screens of circuit boards by soldering according to claim 2, wherein the following dimensions are used in a preferred embodiment of the heat head: a length of about 7.8 cm, a width of about 0.8 cm, a height of about 1.1 cm, with the bottom surface of the heat head having a width of about 0.3 cm, with the top surface of the heat head having a width of about 0.8 cm, with the shank being over about 2.6 cm in length and about 0.8 cm in diameter, with the number of cylindrical passages extending vertically through the heat head having a diameter of about 0.4 cm and a height of about 1.1 cm, and with the first side wall and the second side wall running vertically down from the top surface for about 0.3 cm and then running for about 0.9 cm slantedly towards the bottom surface.

9. The soldering device to be used with the plate assembly for changing screens of circuit boards by soldering according to claim 2, wherein some engravings exist on the first side wall and on the second side wall of the heat head in order to facilitate utilization, improve performance and increase efficiency of the heat head.

10. The plate assembly to be used with the soldering device for changing screens of circuit boards by soldering according to claim 1, wherein sizes and quantities of the number of narrow horizontal top plates, the number of pads, the number of fixture pins, the number of guiding pins, the number of screws, the number of cylindrical passages and the horizontal bottom plate may be changed to develop additional space and to change capacity of the plate assembly.

11. A method, used upon removal of an original screen of a circuit board, for soldering a new screen to the circuit board by using a plate assembly and a soldering device, said method comprising the following steps:

(a) applying a board stripping solution to one of a number of narrow horizontal top plates of the plate assembly where the new screen is to be positioned for soldering;

(b) horizontally positioning the new screen on one of the number of narrow horizontal top plates that has been cleaned by the board stripping solution;

(c) horizontally placing a piece of silicon tape over the new screen to cover the new screen when a heat head is used for soldering the new screen to the circuit board;

(d) horizontally positioning the circuit board over a horizontal bottom plate by exerting a number of fixture pins through some holes in the circuit board, with each of said number of fixture pins being erected in and protruding from one of a number of cylindrical passages in the horizontal bottom plate, in order to fix the circuit board in a stable manner and adjacent to one of the number of narrow horizontal top plates during soldering so that the new screen is adjacent to and in contact with the circuit board;

(e) by holding a heating handle of the soldering device, vertically inserting each of a number of cylindrical passages located in the heat head of the soldering device through one of a number of guiding pins, with each of the number of guiding pins being positioned adjacent to one of the number of narrow horizontal top plates and adjacent to one of a number of pads and being vertically erected through and protruding upwardly from the horizontal bottom plate, so that each of the number of cylindrical passages of the heat head fits properly in one of the number of guiding pins and so that the heat head comes into contact with the piece of silicon tape positioned on top of the new screen and remains in a stable manner over the piece of silicon tape during soldering;

(f) running an electric current through the heating handle of the soldering device in order to heat the heat head;

(g) pressing the heat head against the piece of silicon tape for a short period of time in order to solder the new screen to the circuit board; and (h) removing the soldering device and the piece of silicon tape after the new screen is soldered to the circuit board.

12. The method for soldering a new screen to the circuit board by using a plate assembly and a soldering device according to claim 11, wherein the circuit board is a pager board.

13. The method for soldering a new screen to the circuit board by using a plate assembly and a soldering device according to claim 11, wherein the soldering device is placed orthogonally over the piece of silicon tape and over the new screen.

* * * * *